United States Patent [19]

Takahashi et al.

[11] Patent Number: 4,551,575
[45] Date of Patent: Nov. 5, 1985

[54] SUBSTRATE FOR AMORPHOUS SILICON SEMICONDUCTOR MATERIAL

[75] Inventors: Kiyoshi Takahashi; Makoto Konagai, both of Tokyo; Toshihiko Yoshitomi, Sagamihara; Takeshi Omori, Yokohama, all of Japan

[73] Assignee: Mitsubishi Chemical Industries Limited, Tokyo, Japan

[21] Appl. No.: 535,721

[22] Filed: Sep. 26, 1983

[30] Foreign Application Priority Data

Sep. 24, 1982 [JP]  Japan .................................. 57-166161

[51] Int. Cl.[4] ............................................ H01L 31/06
[52] U.S. Cl. ..................................... 136/255; 136/256; 136/258; 357/2; 357/30; 357/71; 428/620
[58] Field of Search ............... 428/620, 621; 136/255, 136/256, 258 AM; 357/2, 30, 65, 71

[56] References Cited

U.S. PATENT DOCUMENTS

| 4,251,289 | 2/1981 | Moustakas et al. ................. 136/255 |
| 4,284,689 | 8/1981 | Craighead et al. ................. 428/620 |
| 4,334,523 | 6/1982 | Spanoudis ........................... 428/620 |
| 4,359,367 | 11/1982 | Zukotynski et al. ............. 204/37 R |
| 4,431,710 | 2/1984 | Lifshin et al. ....................... 428/620 |
| 4,439,470 | 3/1984 | Sievers ................................ 428/621 |

FOREIGN PATENT DOCUMENTS

| 56-94677 | 7/1981 | Japan ........................... 136/258 AM |
| 57-211279 | 12/1982 | Japan ........................... 136/258 AM |

*Primary Examiner*—Aaron Weisstuch
*Attorney, Agent, or Firm*—Oblon, Fisher, Spivak, McClelland & Maier

[57] ABSTRACT

A substrate for an amorphous silicon semiconductor material characterized in that a metal or alloy film is formed on the surface of a metal substrate by means of an electroplating treatment.

6 Claims, No Drawings

SUBSTRATE FOR AMORPHOUS SILICON SEMICONDUCTOR MATERIAL

BACKGROUND OF THE INVENTION

1. Field of the Invention

The present invention relates to a substrate for an amorphous silicon semiconductor material and, more particularly, to a substrate for an amorphous silicon semiconductor material which is cheap and advantageously mass-produced and having improved short-circuit current and energy conversion efficiency. It is still more concerned with a substrate for a semiconductor solar cell.

2. Description of the Prior Art

Semiconductor devices which make use of an amorphous silicon (hereafter referred to as "a-Si"), such as a photosensor, a switch element and an image device etc. are well known.

Especially, the so-called a-Si solar cell which converts light to electrical energy by means of a photoelectric effect of a-Si is widely known to be used for consumer articles such as electric calculators and watches etc., or for industrial articles such as used for generation of electrical enery by means of solar light.

However, solar cells heretofore in use are high in cost and further cost reduction is required for large area system such as required for generation of electrical energy by means of solar light.

Until now, a-Si solar cells have been produced by, for example, decomposing monosilane ($SiH_4$) by means of glow discharge to deposit a-Si on a substrate such as stainless steel etc. and then a transparent electroconductive layer such as $SnO_2$ etc. or a Schottky barrier layer such as platinum etc. is provided thereupon, and further an electrode layer is provided thereupon.

Usually, the a-Si is used as a thin layer having thickness of around 1 $\mu$m. Consequently, if there is a scratch or a projection on a surface of the substrate, it becomes a cause of pin-hole occurrence and the upper electrode and the substrate become short-circuited, thereby lowering the photoelectric conversion efficiency.

Accordingly, it is necessary for the surface of the substrate to be in a good state of smoothness without such a defect, that is, it must be subjected to a polishing treatment to acquire a mirror finish.

The polishing treatment, however, has technical difficulties in maintenance of parallelism of the substrate, removal of strains upon polishing, and selection of polishing materials and the like. Further, the yield is low. As a result, much time and high cost become necessary to obtain the desired mirror finish.

In order to improve such defects, it has been proposed to deposit $SnO_2$, $SnO_2$ and $In_2O_3$, or the like on a stainless-steel substrate by means of vacuum evaporation, sputtering or chemical evaporation (Japanese Laid-Open Patent Application No. 69875/1981).

However, in the case of evaporation of a metal on a substrate, it is necessary to provide a very thick layer so as to form a flat surface. Further, the characteristics as a solar cell of the material thus obtained, for example, the short-circuit current value, are not good enough and improvement thereof is urgently required.

SUMMARY OF THE INVENTION

The present inventors have investigated the above-described points concerning a substrate for a semiconductor which can be produced cheaply and having improved characteristics such as short-circuit current value etc. and have found that the desired object is accomplished when a surface of a metal substrate is subjected to an electroplating treatment with the use of a metal such as nickel, chromium and the like, or an alloy. Thus we have completed the present invention.

That is, the gist of the present invention resides in a substrate for an amorphous silicon semiconductor material characterized in that the surface of the metal substrate is provided with a metal or alloy film by means of an electroplating treatment.

DETAILED DESCRIPTION OF THE PREFERRED EMBODIMENTS

In the following the present invention is described in detail. As a metal substrate according to the present invention there may be employed various known ones. For example, there may be preferably employed an aluminium plate, a copper plate, an iron plate, or an iron alloy plate such as stainless steel, etc.

The surface of the metal substrate is preferably smooth and according to the present invention a metal plate obtained by a conventional production method can be advantageously employed without laborious surface grinding which was necessary in the prior art method. Accordingly, it is possible that a metal plate which had been formed in a filmy state by roll forming, for example, can continuously be subjected to a subsequent electroplating treatment and formation of a semiconductor layer, and that mass-production can easily be effected.

A metal substrate having a surface wherein the maximum value of roughness and undulation $(R+W)_{max}$ is not more than 1 $\mu$m, preferably not more than 0.5 $\mu$m, and more preferably not more than 0.3 $\mu$m is advantageously employed. When employing an aluminum plate, a high purity one is better in view of adhesion between the plate and the plating layer. An aluminium plate having purity of not less than 98.5%, preferably not less than 99.0%, is advantageously employed.

In the present invention a metal or alloy film is formed by subjecting the surface of the above-described metal plate to an electroplating treatment.

The metal or alloy film has a reflectance at solar light (i.e., visible light) wavelengths of not less than 65%, preferably not less than 70%.

Such a metal or alloy film is preferably formed by a substance which forms an ohmic electrical contact with the deposited a-Si layer and which does not cause deterioration of the electrical characteristics of the a-Si layer by diffusing and mixing of the constituent elements from the substrate into the deposited a-Si layer.

For example, a metal or alloy film such as, for example, nickel, chromium, rhodium, silver, copper-zinc, copper-tin, tin-cobalt, tin-nickel, and the like may be used.

Prior to electroplating treatment, the surface of the metal substrate is usually subjected to a cleaning treatment by means of alkali degreasing, etching, and a de-smutting treatment with the use of nitric acid, etc.

Subsequently, the substrate may be immersed in a zinc alloy, electroless plating liquid or the like containing zinc, nickel, and potassium cyanide as described in British Pat. No. 1,007,252 to form a an electrolessly plated film of a zinc alloy or the like on the surface of the metal plate, followed by an electroplating treatment.

The electroplating treatment can be accomplished by a known method.

For example, there may be mentioned a nickel plating method wherein a plating liquid containing from 200 to 325 g/l, preferably from 225 to 300 g/l of nickel sulfate, from 35 to 70 g/l, preferably from 45 to 60 g/l of nickel chloride, and from 25 to 45 g/l, preferably from 30 to 40 g/l of boric acid, is adjusted to have a pH value of from 3.5 to 5.3, preferably from 4.0 to 4.8, and an electroplating treatment is effected for from 10 to 40 minutes, preferably from 20 to 30 minutes, at a temperature of from 40° to 70° C., preferably from 50° to 60° C., and a current density of from 1 to 6 A/dm$^2$, preferably from 2 to 4 A/dm$^2$.

In the metal plating liquid there may be optionally added known additives such as a brightener and the like.

In the case of chromium plating, there may be mentioned a method wherein an electroplating treatment is effected for from 1 to 10 minutes, preferably from 2 to 4 minutes, in a plating liquid containing from 150 to 450 g/l, preferably from 230 to 270 g/l, of anhydrous chromic acid, from 1 to 4.5 g/l, preferably from 1.5 to 3 g/l, of sulfuric acid and from 1 to 6 g/l, preferably from 1.5 to 3 g/l, of trivalent chromium, at a temperature of from 40° to 55° C., preferably from 42° to 48° C., and a current density of from 8 to 30 A/dm$^2$, preferably from 10 to 15 A/dm$^2$.

In the case of rhodium plating, there may be mentioned a method wherein an electroplating treatment is effected for from 1.0 to 60 seconds, preferably from 20 to 30 seconds, in a plating liquid containing from 0.5 to 5 g/l, preferably from 1 to 3 g/l, of rhodium, from 30 to 200 g/l, preferably from 40 to 80 g/l, of sulfuric acid, at a temperature of from 35° to 60° C., preferably from 40° to 55° C., and a current density of from 1 to 10 A/dm$^2$, preferably from 2 to 5 A/dm$^2$.

The metal or alloy film is, usually, formed to a thickness of from 0.01 to 30 μm, preferably from 3 to 30 μm, more preferably from 5 to 20 μm.

In the present invention, it is preferable that nickel plating be effected upon the substrate and thereupon chromium or rhodium plating be effected to a thickness of not less than 50 Å, preferably from 100 Å to 1 μm, since the obtained substrate is superior in adhesion between the substrate and the plating film and in the smoothness of the surface.

Further, in the present invention, a metal such as molybdenum, stainless steel, titanium, and the like may be optionally evaporated on the above-described metal or alloy film to have thickness of from 100 to 5,000 Å by means of a known method.

The depositing of a-Si on the metal substrate which is previously subjected to the electroplating treatment according to the present invention can be accomplished by means of a known method such as a glow discharge, sputtering, or ion-plating. Among them, the glow discharge method is preferably employed since it can form a homogeneous a-Si layer having a large area.

For example, a-Si layer is formed on the substrate by means of, for example, heating said substrate at about from 200° to 300° C., keeping the reactive gas pressure from about 0.1 to 10 Torr, and subjecting the substrate to a glow discharge treatment. Either a direct current (DC) or a high frequency (RF) glow discharge method can be employed.

To the silane or higher silane gas such as disilane or the like, which are used as the source gas, a trace amount, usually an amount of not more than 10 atom % per Si, of a gap such as, for example $B_2H_6$ or $PH_3$ and the like, may be added in order to adjust the band gap or electric resistance of the a-Si layer or to control the doping. Further, in the light incident side (window side layer) of the semiconducting layer, the amount of light which enters the i-layer may be increased by mixing the silane gas with a hydrocarbon gas such as $CH_4$, $C_2H_6$ and the like in an amount not exceeding the amount of the silane gas.

A semiconductor layer of a-Si having a laminated structure of regions of different a-Si containing impurities of different kinds may be formed by continuously or discontinuously changing the concentration or kinds of these added gases according to a known method. For example, there may be mentioned the so-called p-i-n structure wherein n-type, i-type, and p-type, or p-type, i-type, and n-type regions are deposited in that order on the substrate, or the so-called p-n structure wherein p-type and n-type regions are deposited in that order from the substrate or in the reversed order.

The semiconductor layer is usually formed to have a thickness of about from 0.05 to 1.5 μm. In the case of the laminated structure, for example, the p-i-n structure, the p layer may be from 50 to 200 Å, the i layer from 0.1 to 1 μm, and the n-layer from 100 to 500 Å thick.

A semi-transparent electrode layer of $SnO_2$, $In_2O_3$, a mixture thereof, palladium, gold, or the like is evaporated in a thickness of from about 50 to 3000 Å on the above-described semiconductor layer according to a known method to obtain a solar cell, etc.

In the present invention, a known anti-reflective film or surface-protecting film may be provided on the semiconducting layer.

As described above, the substrate of the present invention is cheap and advantageous in mass-production and further, provides a semiconductor material having good short-circuit current value or the like.

Having generally described the invention, a more complete understanding can be obtained by reference to the following specific examples, which are included for purposes of illustration only and are not intended to be limiting unless otherwise specified.

EXAMPLE 1

An aluminium plate (purity of 99.5%) having a $(R+W)_{max}$ value of about 0.3 μm was immersed for 30 seconds in an alkaline aqueous solution at 45° C. and subsequently washed with water. Then, said aluminium plate was immersed for 30 seconds in a 33 vol % nitric acid aqueous solution at 25° C., followed by washing with water.

An electrolessly deposited film was formed by means of immersing the plate in a Bondaldip solution (a zinc alloy electroless plating solution manufactured by W. Canning Limited) under stirring for one minutes at 25° C.

After washing, said substrate was subjected to a metal plating treatment for 24 minutes under stirring in an aqueous nickel plating solution containing the following list of compounds at a pH of 4.4, temperature of 55° C., and current density of 3 A/dm$^2$. The obtained nickel layer had a thickness of about 10 μm.

| Constituents of nickel | Nickel sulfate.hexahydrate | 260 g/l |
|---|---|---|
| | Nickel chloride.hexahydrate | 57 g/l |
| | Boric acid | 38 g/l |

| | | |
|---|---|---|
| plating solution | "Nizol" I (brightener manufactured by W. Canning Limited) | 10 ml/l |

Then, after washing, the treated substrate was subjected to another metal plating treatment for 3 minutes in an aqueous chromium plating solution containing the following list of compounds at a temperature of 45° C. and a current density of 10 A/dm$^2$. The obtained chromium layer had a thickness of about 0.25 μm.

| Constituents of chromium plating solution | Anhydrous chromic acid | 250 g/l |
|---|---|---|
| | Sulfuric acid | 2.5 g/l |
| | Trivalent chromium | 2 g/l |

As described above, a substrate for a semiconductor material comprising a metal film having two layer structure comprising a nickel layer and a chromium layer on an aluminium plate was obtained.

EXAMPLE 2

A nickel layer was formed on an aluminium plate in the same way as described in Example 1.

Subsequently, after washing with water, said plate was subjected to a metal plating operation for 20 seconds in an aqueous rhodium plating solution containing 1.5 g/l of rhodium and 40 g/l of sulfuric acid at a temperature of 55° C. and a current density of 4 A/dm$^2$. The obtained rhodium layer had the thickness of about 0.02 μm.

As described above, a substrate for a semiconductor material comprising a metal film having a two layer structure comprising a nickel layer and a rhodium layer on an aluminium plate was obtained.

EXAMPLE 3

A molybdenum layer having a thickness of about 1000 Å was formed by a known electron beam incorporation method on the chromium layer of a substrate for a semiconductor material as obtained in Example 1 to afford a substrate for a semiconductor material.

APPLICATION EXAMPLES 1 AND 2

The substrates for semiconductor materials as obtained in Examples 1 and 2 were heated at 250° C. in a nitrogen gas stream and further subjected to a nitrogen plasma treatment to remove water and impurities attached to the surface.

Then, with the use of a capacitively-coupled type high-frequency glow discharge decomposition apparatus, a mixed gas containing SiH$_4$ gas and B$_2$H$_6$ gas in an amount of 0.2 vol % per SiH$_4$ gas was subjected to a glow discharge decomposition at a temperature of 230° C., gas pressure of 0.2 Torr, and high frequency output of 4W to deposit a p-type a-Si layer having a thickness of about 100 Å.

In a continuous fashion, an i-type a-Si layer having a thickness of about 5,000 Å was deposited thereupon with the use of a SiH$_4$ gas under the same conditions as described above. Further, with the use of a mixed gas containing SiH$_4$ gas and PH$_3$ gas in an amount of 2 vol % per SiH$_4$ gas, an n-type a-Si layer having a thickness of about 150 Å was deposited on the above-described i-layer to form a semiconductor layer comprising p-i-n layers on the substrate.

Then, an ITO layer having a thickness of about 500 Å was formed as a transparent electrode on the semiconductor layer by means of a known electron beam evaporation method to obtain a semiconductor solar cell device.

The characteristics of the solar cell were then measured by a conventional method. A solar simulator was employed as a light source and it provided a light intensity of AM-1 (100 mw/cm$^2$). The results are shown in Table 1.

REFERENCE EXAMPLES 1 TO 3

Semiconductor devices were obtained by forming p-i-n layers and an ITO layer in the same way as described in Application Example 1 except that as a substrate an aluminum plate without the metal plating treatment (Reference Example 1), a commercial stainless steel plate the surface of which was subjected to a mechanochemical polishing treatment (manufactured by Hitachi Shipbuilding & Engineering Co., Ltd.) (Reference Ex. 2). and an abovereferred to commercial stainless steel plate on which was formed a molybdenum layer having a thickness of about 1,000 Å by a conventional electron beam evaporation method (Reference Ex. 3) were employed.

The solar cell characteristics of these devices were measured in the same way as in Application Example 1 and the results are shown in Table 1.

TABLE 1

| | Substrate | Short circuit current (mA/cm$^2$) | Open circuit voltage (V) |
|---|---|---|---|
| Application Example 1 | Cr/Ni Al | 13.1 | 0.82 |
| Application Example 2 | Rh/Ni Al | 13.2 | 0.75 |
| Reference Example 1 | Al | (no current) | |
| Reference Example 2 | SUS*[1] | 10.2 | 0.79 |
| Reference Example 3 | *[2] Mo SUS | 11.1 | 0.83 |

*[1]Stainless steel plate the surface of which was subjected to a mechanochemical polishing treatment.
*[2]Mo was evaporated on the stainless steel plate which was subjected to a mechanochemical polishing treatment.

APPLICATION EXAMPLES 3 AND 4

Substrates for semiconductor materials as were obtained in Examples 1 and 3 were subjected to the same treatment as described in Application Examples 1 and 2 to remove water and impurities attached to the surface.

Then, with the use of a capacitively-coupled high-frequency glow discharge decomposition apparatus, mixed gases comprising SiH$_4$ gas and B$_2$H$_6$ gas in an amount of 0.4 vol % per SiH$_4$ gas were subjected to a glow discharge decomposition treatment at a substrate temperature of 230° C., gas pressure of 0.2 Torr, and high frequency output of 4W, to deposit a p-type a-Si layer having a thickness of about 200 Å. Then, with the use of SiH$_4$ gas, an i-type a-Si layer having a thickness of about 5,000 Å was deposited thereupon at a temperature of 250° C. and a gas pressure of 1 Torr.

Further, with the use of mixed gases comprising SiH$_4$ gas and a PH$_3$ gas in an amount of 2 vol % per SiH$_4$ gas, an n-type a-Si layer having a thickness of about 150 Å was deposited at a gas pressure of 0.2 Torr to form a semiconductor layer.

Then, a transparent electrode was provided in the same way as described in Application Example 1 and the solar cell characteristics were measured. The results are shown in Table 2.

TABLE 2

| | Substrate | Fill factor (%) | Conversion efficiency (%) |
|---|---|---|---|
| Application Example 3 | Cr/Ni / Al | 61.8 | 5.91 |
| Application Example 4 | Mo/Cr/Ni / Al | 63.5 | 6.27 |

Having now fully described this invention, it will be apparent to one of ordinary skill in the art that many changes and modifications can be made thereto without departing from the spirit or scope of the invention as set forth herein.

What is claimed as new and intended to be covered by Letters Patent is:

1. An amorphous silicon semiconductor solar cell comprising one or more layers of amorphous silicon semiconductor material, a metal substrate on one side of and in contact with the amorphous silicon semiconductor material and a transparent electroconductive layer or Schottky barrier layer on the other side of and in contact with the silicon semiconductor material, characterized in that the surface of the metal substrate in contact with the amorphous silicon semiconductor is the surface of a two layer laminated metal or alloy film present upon an aluminum plate or film base and formed by means of an electroplating treatment on said aluminum plate or film base.

2. An amorphous silicon semiconductor solar cell according to claim 1 wherein the said two layer laminated metal or alloy film formed by electroplating has a laminated structure in which nickel and chromium or nickel and rhodium are electroplated in the stated sequence on the aluminum plate or film.

3. An amorphous silicon semiconductor solar cell according to claim 1 wherein the said metal or alloy film formed by electroplating has a thickness of from 0.01 to 30 $\mu$m.

4. A multilayer structure comprising at least one layer of an amorphous silicon semiconductor material in contact with the surface of two layer laminated metal or alloy film present upon an aluminum plate or film base and formed by electroplating said aluminum plate or film base.

5. A structure according to claim 4, wherein the said two layer laminated metal or alloy film has a laminated structure in which nickel and chromium or nickel and rhodium are electroplated in the stated sequence on the aluminum plate or film base.

6. A structure according to claim 4, wherein the said metal or alloy film has a thickness of from 0.01 to 30 $\mu$m.

* * * * *